US010833238B2

(12) United States Patent
Shao et al.

(10) Patent No.: US 10,833,238 B2
(45) Date of Patent: Nov. 10, 2020

(54) WIREBOND CROSS-TALK REDUCTION FOR QUANTUM COMPUTING CHIPS

(71) Applicant: International Business Machines Corporation, Armonk, NY (US)

(72) Inventors: Dongbing Shao, Wappingers Falls, NY (US); Markus Brink, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/114,124

(22) Filed: Aug. 27, 2018

(65) Prior Publication Data

US 2020/0066961 A1 Feb. 27, 2020

(51) Int. Cl.
*H01L 39/02* (2006.01)
*H01L 27/18* (2006.01)
*H01L 39/22* (2006.01)
*H01L 39/24* (2006.01)
*G06N 10/00* (2019.01)

(52) U.S. Cl.
CPC ............ *H01L 39/025* (2013.01); *H01L 27/18* (2013.01); *H01L 39/223* (2013.01); *H01L 39/2493* (2013.01); *G06N 10/00* (2019.01)

(58) Field of Classification Search
CPC .................................................... H01L 39/025
USPC .......................................................... 257/20
See application file for complete search history.

(56) References Cited

U.S. PATENT DOCUMENTS

| 8,008,942 | B2 | 8/2011 | van den Brink et al. |
| 8,300,994 | B2 | 10/2012 | Welch et al. |
| 9,129,224 | B2 | 9/2015 | Lanting et al. |
| 9,178,154 | B2 | 11/2015 | Bunyk |
| 9,836,699 | B1 * | 12/2017 | Rigetti ................. H01L 39/223 |
| 9,892,365 | B2 | 2/2018 | Rigetti et al. |
| 2005/0184403 | A1 | 8/2005 | Inagawa |
| 2008/0227284 | A1 | 9/2008 | Rebelo et al. |
| 2013/0161804 | A1 | 6/2013 | Fishley et al. |

(Continued)

FOREIGN PATENT DOCUMENTS

EP   1863103 A2 * 12/2007   ......... G01R 33/0354
WO   9965102 A1   12/1999

OTHER PUBLICATIONS

Bejanin et al; matteo.mariantoni@uwaterloo.ca, The Quantum Socket: Three-Dimensional Wiring for Extensible Quantum Computing, Google, Inc., Santa Barbara, California 93117, USA, Jun. 2, 2016.

(Continued)

*Primary Examiner* — Ajay Arora
(74) *Attorney, Agent, or Firm* — Garg Law Firm, PLLC; Rakesh Garg; Keivan Razavi

(57) ABSTRACT

A configuration of wirebonds for reducing cross-talk in a quantum computing chip includes a first wirebond coupling a first conductor of a quantum computing circuit with a first conductor of an external circuit. The embodiment further includes in the configuration a second wirebond coupling a second conductor of the quantum computing circuit with a second conductor of the external circuit, wherein the first wirebond and the second wirebond are separated by a first vertical distance in a direction of a length of the first conductor.

15 Claims, 7 Drawing Sheets

(56) References Cited

U.S. PATENT DOCUMENTS

2017/0220510 A1 8/2017 Hilton et al.

OTHER PUBLICATIONS

Blanvillain et al., "Suppressing on-chip electromagnetic crosstalk for spin qubit devices", Journal of Applied Physics, American Institute of Physics, US, Sep. 15, 2012, vol. 112, No. 6, http://dx.doi.org/10.1063/1.4752863.
PCT, International Searching Authority, PCT/EP2019/071755, Nov. 14, 2019.

* cited by examiner

WIREBOND CROSS-TALK REDUCTION FOR QUANTUM COMPUTING CHIPS

TECHNICAL FIELD

The present invention relates generally to a device, a fabrication method, and fabrication system for wirebonds on superconducting quantum computing chips. More particularly, the present invention relates to a device, method, and system for wirebond cross-talk reduction for quantum computing chips.

BACKGROUND

Hereinafter, a "Q" prefix in a word or phrase is indicative of a reference of that word or phrase in a quantum computing context unless expressly distinguished where used.

Molecules and subatomic particles follow the laws of quantum mechanics, a branch of physics that explores how the physical world works at a more fundamental level. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of quantum bit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where classical computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These is and 0s act as on/off switches that ultimately drive computer functions. Quantum computers, on the other hand, are based on qubits, which differ from classical bits according to two key principles of quantum physics: superposition and entanglement. Superposition means that each qubit can represent both a 1 and a 0 at the same time. Entanglement means that qubits in superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two superconducting metal layers by a thin non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. Information is carried or transmitted in a single photon. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not unintentionally alter the states of the qubits, such as by injecting or dissipating energy in any significant manner, or influence the relative phase between the |0> and |1> states of the qubit. This operational constraint on any circuit that operates with quantum information necessitates special considerations in fabricating semiconductor and superconducting structures that are used in such circuits.

The connection lines or wirebonds between an external circuit and a q-circuit, e.g., an input line to the q-circuit or an output line from the q-circuit, or both, transfer signals between the q-circuit and the external circuit, and vice versa. Cross-talk is undesirable interference or unwanted transfer of signals in a range of frequencies of a signal carried by a neighboring signal line. A signal on a wirebond between the external circuit and a conductive pad on the q-circuit can generate cross-talk to nearby wirebonds. This cross-talk can be in the microwave frequency spectrum. A signal on a wirebond may correspond to information carried or transmitted by a single photon or only a few photons. Thus, quantum computing chips require a greater level of sensitivity than conventional computers. For the reasons described herein, cross-talk between nearby wirebonds is undesirable when the wirebonds and signal relate to quantum computing using q-circuits. Thus, there is a need to reduce and/or mitigate cross-talk between nearby wirebonds in a quantum computing chip.

The waveguide structures used in a q-circuit are designed to confine the microwave signals and minimize cross-talk between different parts of the circuit. This can be achieved, for example, by a large enough ground plane that separates two coplanar waveguides. On-chip waveguides can end in conductive pads, from where external circuits can be connected using wirebonds. At the location of the wirebonds, however, additional coupling between different signal lines is possible, which can lead to larger (undesirable) cross-talk.

The illustrative embodiments recognize that q-circuits are designed to minimize cross-talk on the q-circuit but ground planes and/or shielding are difficult between the wirebonds. Furthermore, the illustrative embodiments recognize as the number of qubits increase on the q-circuit, the number of conductors from where the qubits can be connected to external circuits also increase. Fabricating an increased number of qubits in the same size chip causes the conductor density on the chip to increase. Accordingly, the wirebonds from such conductors become physically closer to other wirebonds on the same chip. Thus, the wirebonds become more crowded and the crowding results in increased inter-wirebond cross-talk. Additionally, the illustrative embodiments recognize increasing the size of the q-circuit to accommodate for wirebond spacing results in inefficiencies and cost increases due to the large q-circuit size.

SUMMARY

The illustrative embodiments provide a wirebond cross-talk reduction device for quantum computing chips, and a method and system of fabrication therefor. An embodiment constructs a configuration of wirebonds for reducing cross-talk in a quantum computing chip to include a first wirebond coupling a first conductor of a quantum computing circuit with a first conductor of an external circuit. The embodiment further includes in the configuration a second wirebond coupling a second conductor of the quantum computing circuit with a second conductor of the external circuit, wherein the first wirebond and the second wirebond are separated by a first vertical distance in a direction of a length of the first conductor.

In one embodiment, an orientation of the second wirebond is angled from an orientation of the first wirebond.

In another embodiment, the orientation of the second wirebond is substantially orthogonal to the orientation of the first wirebond.

In another embodiment, the orientation of the second wirebond is substantially parallel to the orientation of the first wirebond.

In another embodiment, the configuration further includes a third wirebond coupling a third conductor of the quantum computing circuit with a third conductor of the external circuit, wherein the second wirebond and the third wirebond are separated by a second vertical distance.

In another embodiment, the first vertical distance and the second vertical distance are equal.

In another embodiment, an orientation of the third wirebond is angled from an orientation of the second wirebond.

In another embodiment, the orientation of the third wirebond is substantially similar to an orientation of the first wirebond.

In another embodiment, the configuration further includes a fourth wirebond coupling a fourth conductor of the quantum computing circuit with a fourth conductor of the external circuit, wherein the third wirebond and the fourth wirebond are separated by a third vertical distance.

In another embodiment, the third vertical distance is equal to a sum of the first vertical distance and the second vertical distance.

In another embodiment, the third vertical distance is equal to the first vertical distance.

In another embodiment, the third vertical distance is equal to the second vertical distance.

In another embodiment, an orientation of the fourth wirebond is angled from an orientation of the third wirebond.

In another embodiment, an orientation of the fourth wirebond is substantially parallel to an orientation of the second wirebond.

An embodiment includes a method for building the configuration of wirebonds.

An embodiment includes a system for constructing or assembly the configuration of wirebonds.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
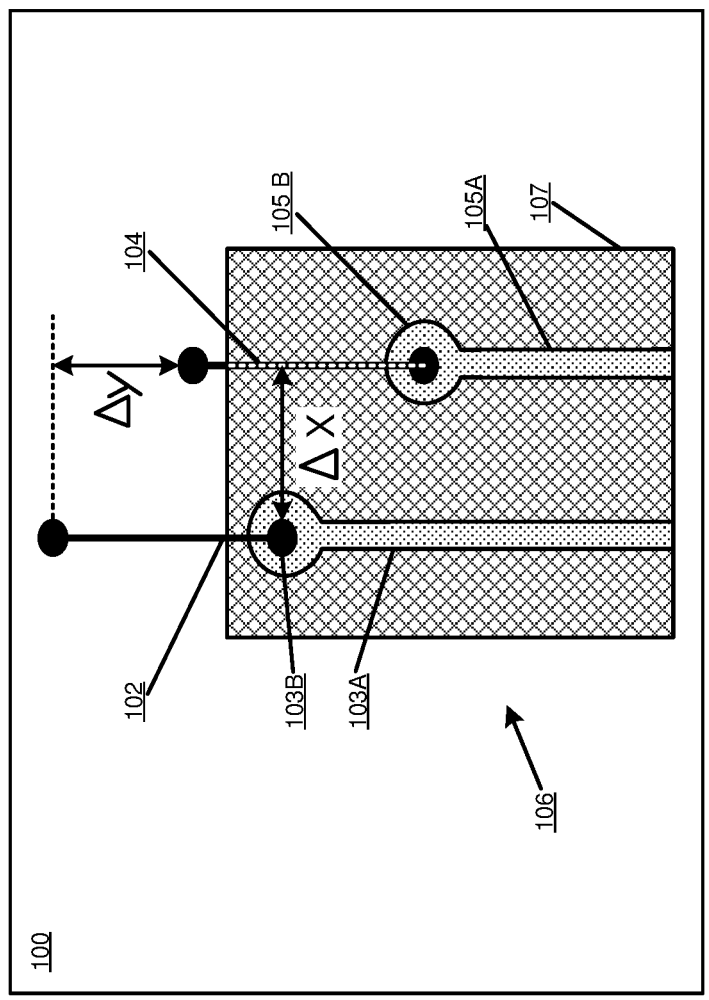
FIG. 1 depicts a schematic diagram of an example wirebond spacing for a q-circuit in accordance with an illustrative embodiment.

The illustrative embodiments used to describe the invention generally address and solve the above-described problem of cross-talk between the wirebonds for quantum computing chips. The illustrative embodiments provide for increasing wirebond separation distance while maintain q-circuit size, which address the above-described need or problem.

An operation described herein as occurring with respect to a frequency or frequencies should be interpreted as occurring with respect to a signal of that frequency or frequencies. All references to a "signal" are references to a microwave frequency signal unless expressly distinguished where used.

An embodiment provides a configuration for increased wirebond separation distance for q-circuits. Another embodiment provides a fabrication method for the increased wirebond separation configuration, such that the method can be implemented as a software application. The application implementing a fabrication method embodiment can be configured to operate in conjunction with an existing semiconductor fabrication system—such as a lithography system, or a circuit assembly system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example resistors, inductors, capacitors, waveguides, and other circuit components are used in the figures and the illustrative embodiments. In an actual fabrication or circuit, additional structures or component that are not shown or described herein, or structures or components different from those shown but for a similar function as described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function within a q-circuit, and such adaptations are contemplated within the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a schematic diagram of an example wirebond spacing for a q-circuit in accordance with an illustrative embodiment. Configuration 100 comprises a set of two or more wirebonds 102, 104. Wirebonds 102, 104 connect an external circuit to q-circuit 106. For example, wirebond 102 couples to conductor 103A via conductive pad 103B and wirebond 104 couples to conductor 105A via conductive pad 105B. Conductor 103A, conductor 105A, pad 103B, and pad 105B are fabricated on substrate 107. A portion of wirebond 102 is separated from a corresponding portion of wirebond 104 by a lateral distance, $\Delta x$, and a vertical distance, $\Delta y$, as shown in the depicted example.

Figure 2:
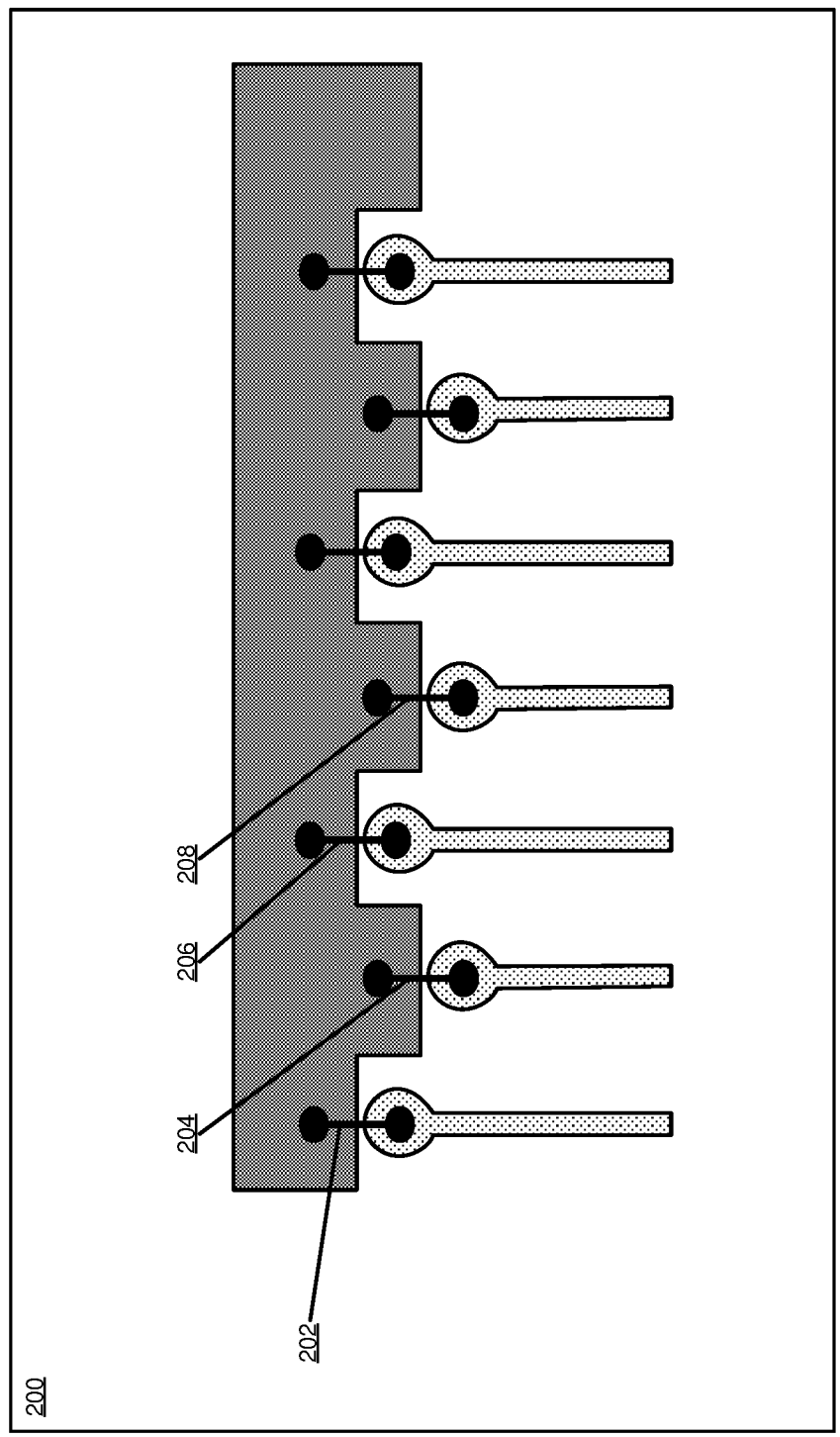
FIG. 2 depicts an example set of wirebonds between a q-circuit and an external circuit in accordance with an illustrative embodiment.

With reference to FIG. 2, this figure depicts an example set of wirebonds between a q-circuit and an external circuit in accordance with an illustrative embodiment. Configuration 200 comprises a set of two or more wirebonds 202, 204, 206, 208 . . . . For example, wirebonds 202 and 204 are positioned in a vertically staggered manner, in a direction of a length of the conductor. The staggering causes the corresponding portions of wirebonds 202 and 204 to be separated from each other by a lateral distance and a vertical distance. Thus, where the corresponding portions of wirebonds 202 and 204 would only have lateral separation from one another in the prior-art, the staggered placement causes a diagonal distance larger than the lateral distance to separate the same corresponding portions of wirebonds 202 and 204. Separation of adjacent wirebonds occurs in both the lateral distance and the vertical distance.

Figure 3:
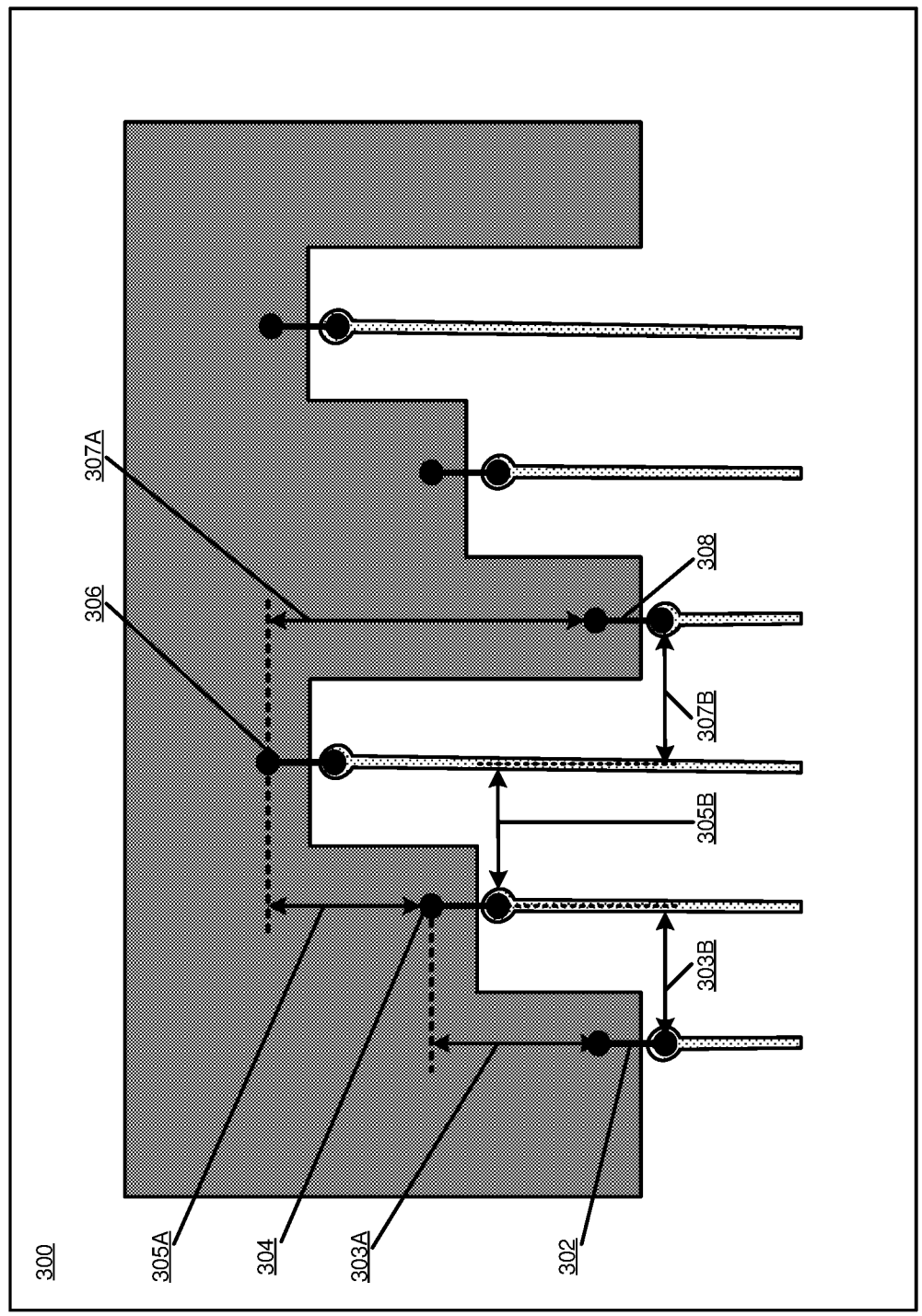
FIG. 3 depicts an example set of wirebonds between a q-circuit and an external circuit in accordance with another illustrative embodiment.

With reference to FIG. 3, this figure depicts an example set of wirebonds between a q-circuit and an external circuit in accordance with an illustrative embodiment. The example configuration 300 in this figure comprises a set of two or more wirebonds 302, 304, 306, 308 . . . . Separation of adjacent wirebonds 302, 304 occurs in a first vertical distance 303A and a first lateral distance 303B. Separation of adjacent wirebonds 304, 306 occurs in a second vertical distance 305A and a second lateral distance 305B. Separation of adjacent wirebonds 306, 308 occurs in a third vertical distance 307A and a third lateral distance 307B.

The wirebonds can be arranged in a variety of arrangements within the scope of the illustrative embodiments. In one embodiment, the first lateral distance 303B is equal to or different from the second lateral distance 305B. In another embodiment, the first vertical distance 303A is equal to or different from the second vertical distance 305A. In another embodiment, the third vertical distance 307A is equal to or different from the sum of the first vertical distance 303A and the second vertical distance 305A. In another embodiment, the third vertical distance 307A is equal to or different from the first vertical distance 303A.

These examples of distances are not intended to be limiting. From this disclosure, those of ordinary skill in the art will be able to conceive many other ways of configuring staggered separation distances between wirebonds and the same are contemplated within the scope of the illustrative embodiments.

Figure 4:
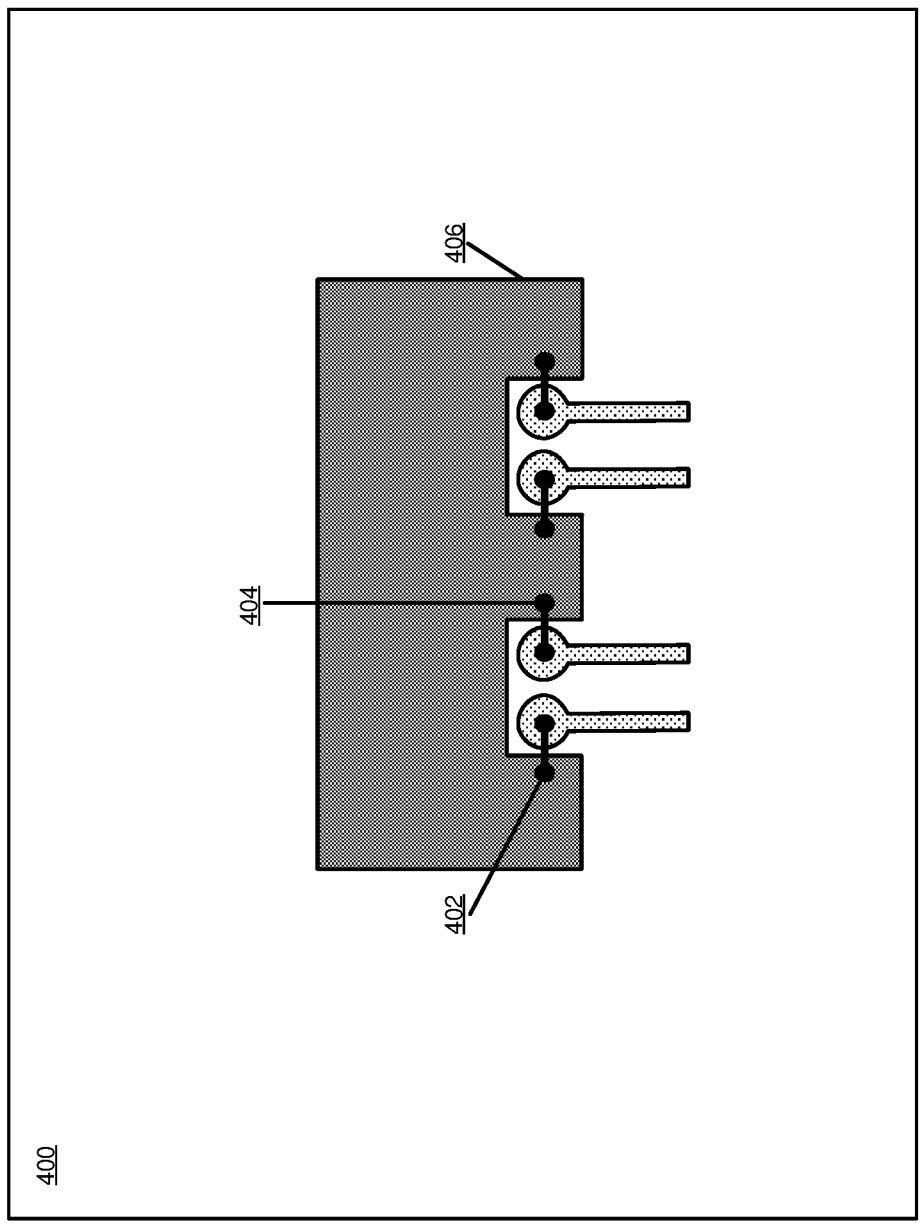
FIG. 4 depicts an example set of wirebonds between a q-circuit and an external circuit in accordance with another illustrative embodiment.

With reference to FIG. 4, this figure depicts an example set of wirebonds between a q-circuit and an external circuit in accordance with an illustrative embodiment. Configuration 400 includes wirebonds 402, 404, and external circuit 406. Orientation of wirebond 404 differs from orientation of wirebond 402. Wirebond 402 faces and extends towards the external circuit 406 in a first direction. Wirebond 404 faces and extends towards the external circuit 406 in a second direction. In one arrangement, the second direction is substantially opposite of the first direction. For example, the second direction is 180 degrees, ±10 degrees, from the first direction.

The wirebonds can be arranged in a variety of other arrangements within the scope of the illustrative embodiments. In one embodiment, one arrangement of adjacent wirebonds includes a vertical separation distance in addition to differing orientations of the adjacent wirebonds.

Figure 5:
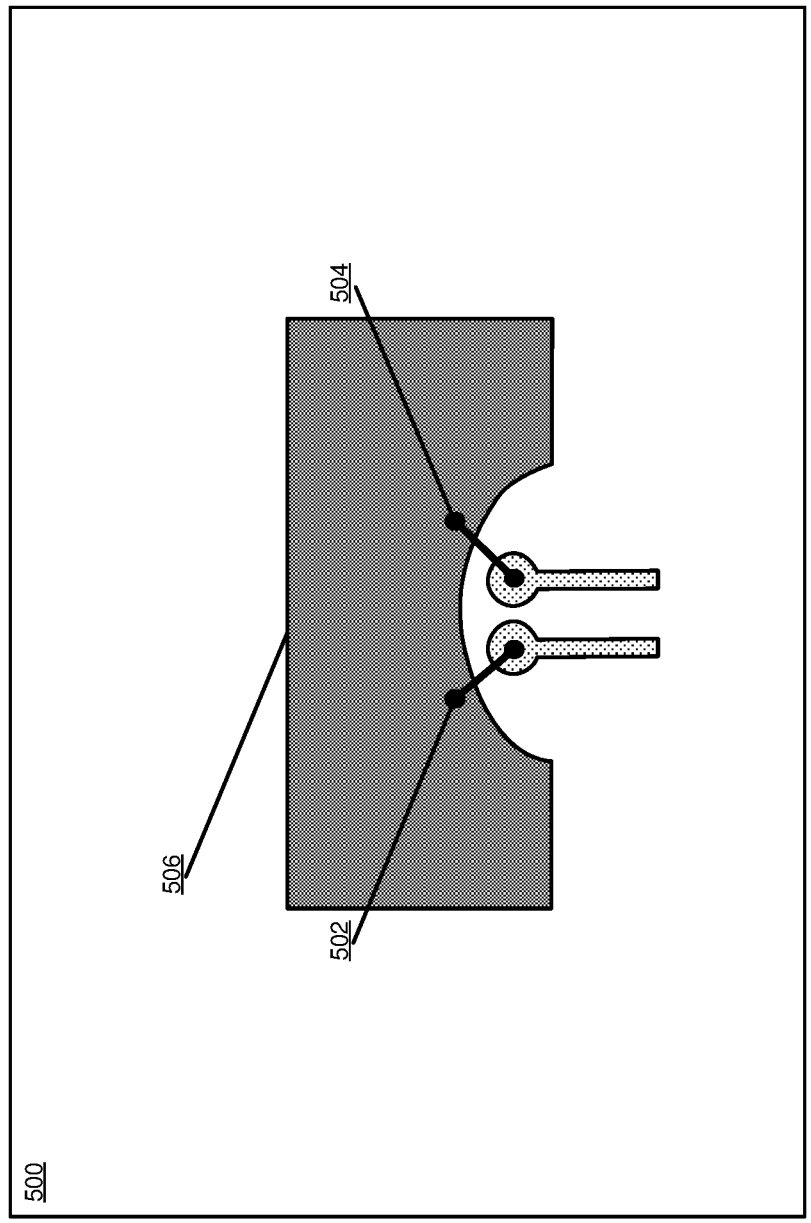
FIG. 5 depicts an example set of wirebonds between a q-circuit and an external circuit in accordance with an illustrative embodiment.

With reference to FIG. 5, this figure depicts an example set of wirebonds between a q-circuit and an external circuit in accordance with an illustrative embodiment. Configuration 500 includes wirebonds 502, 504, and external circuit 506. Orientation of wirebond 504 differs from orientation of wirebond 502. In one arrangement, orientation of wirebond 504 is substantially orthogonal to orientation of wirebond 502. For example, orientation of wirebond 504 is 90 degrees, ±10 degrees, from the orientation of wirebond 502.

Wirebonds 502 and 504 may be oriented relative to each other at other suitable angles, such as at 30, 45, 60, or 135 degrees, to give a few non-limiting examples. Such angled orientations may or may not further include a vertical distance between corresponding portions of wirebonds 502 and 504.

Figure 6:
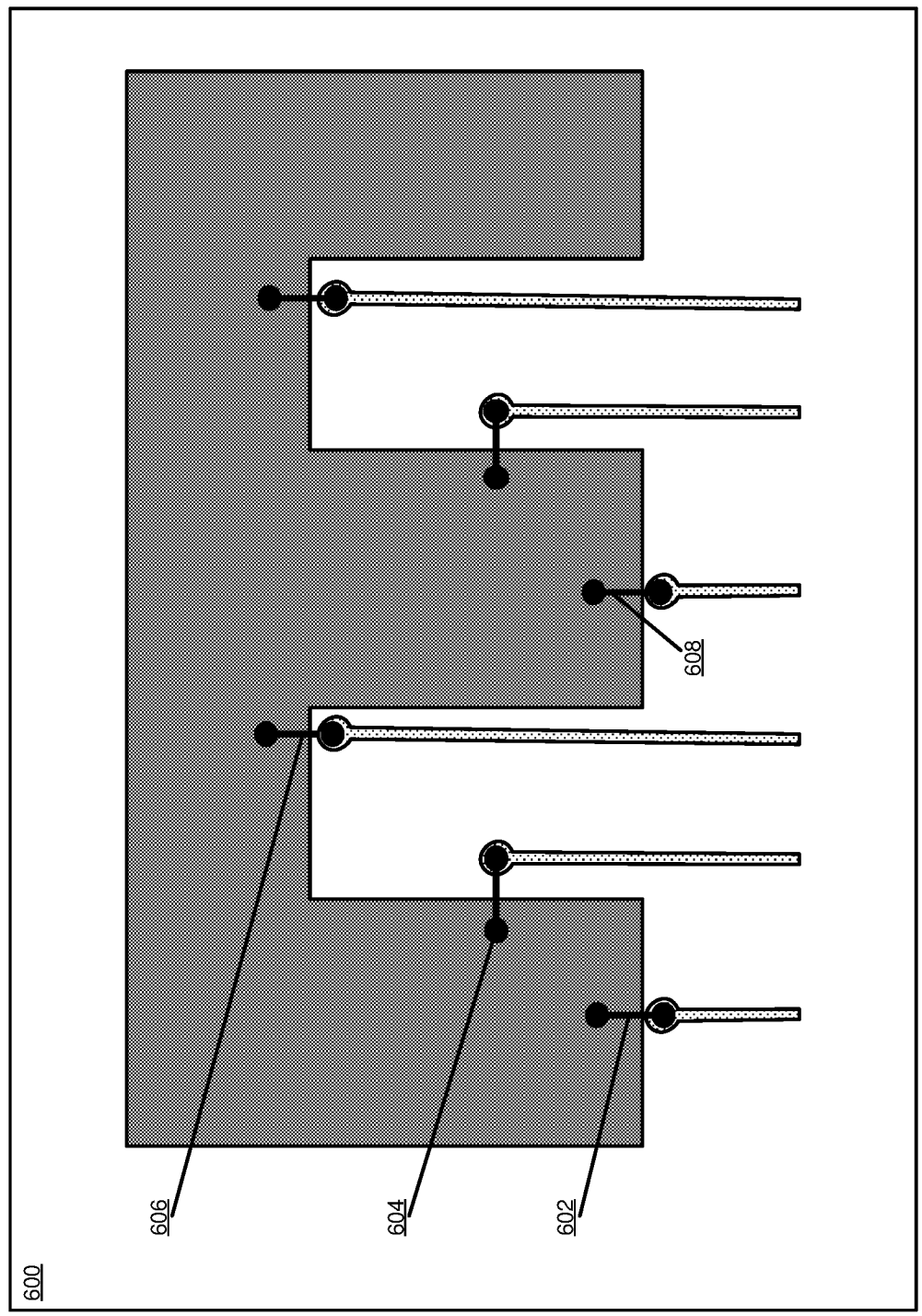
FIG. 6 depicts an example set of wirebonds between a q-circuit and an external circuit in accordance with an illustrative embodiment.

With reference to FIG. 6, this figure depicts an example set of wirebonds between a q-circuit and an external circuit in accordance with an illustrative embodiment. Configuration 600 includes wirebonds 602, 604, 606, 608 .... Separation of adjacent wirebonds 602, 604 occurs in a first lateral distance and a first vertical distance. Orientation of wirebond 604 differs from orientation of wirebond 602. In one embodiment, wirebond 604 is substantially orthogonal to orientation of wirebond 602. In another embodiment, wirebond 604 is oriented at another suitable angle relative to wirebond 602, e.g., at any angle between 10 and 170 degrees.

Separation of adjacent wirebonds 604, 606 occurs in a second lateral distance and a second vertical distance. Orientation of wirebond 606 differs from orientation of wirebond 604. In one embodiment, wirebond 606 is substantially orthogonal to orientation of wirebond 604. In another embodiment, wirebond 606 is oriented at another suitable angle relative to wirebond 604, e.g., at any angle between 10 and 170 degrees. Separation of adjacent wirebonds 606, 608 occurs in a third lateral distance and a third vertical distance. In one embodiment, the third vertical distance is equal to the sum of the first vertical distance and the second vertical distance. The wirebonds can be arranged in a variety of other arrangements within the scope of the illustrative embodiments. For example, the pattern of the arrangement repeats, as shown in FIG. 6.

Figure 7:
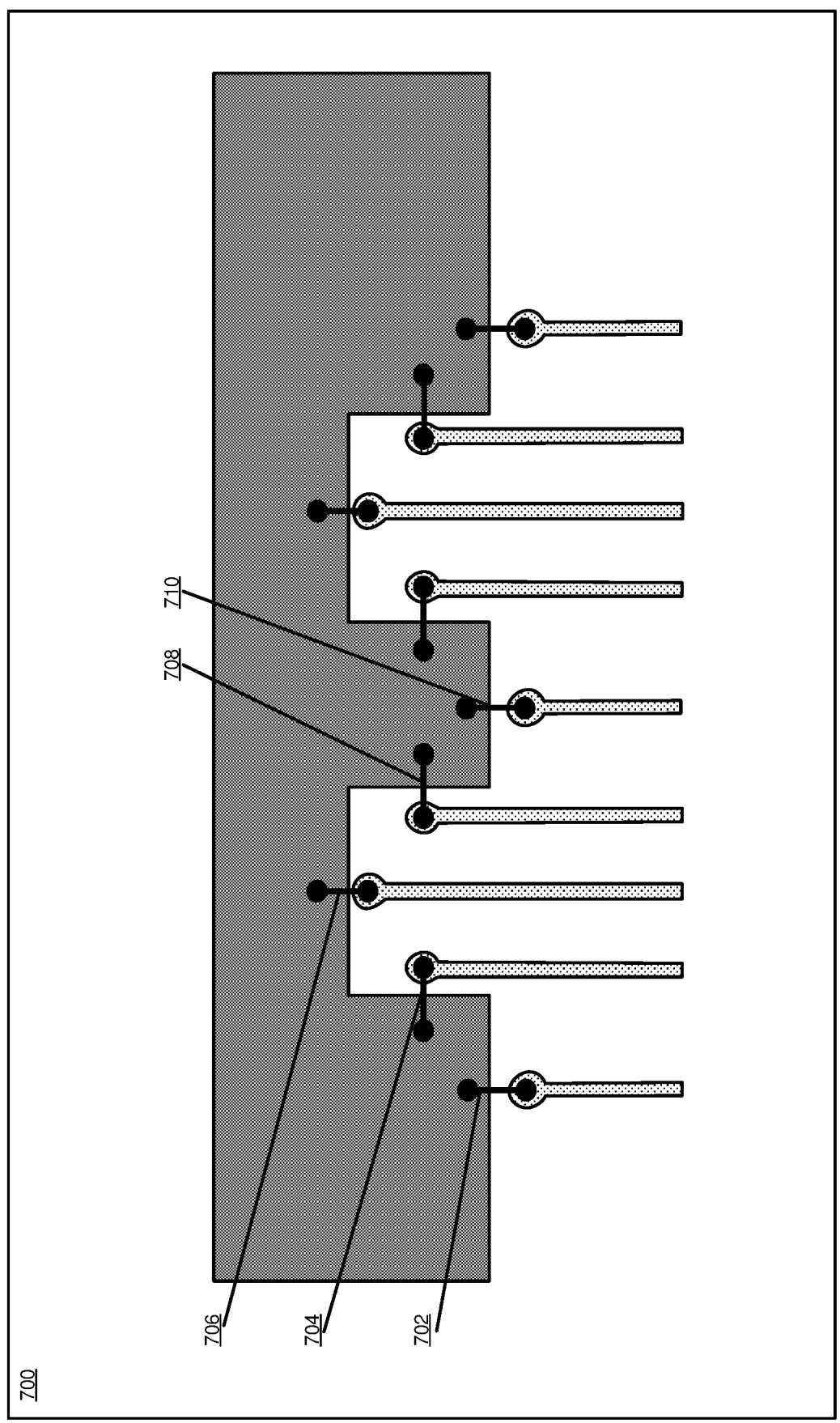
FIG. 7 depicts an example set of wirebonds between a q-circuit and an external circuit in accordance with an illustrative embodiment.

With reference to FIG. 7, this figure depicts an example set of wirebonds between a q-circuit and an external circuit in accordance with an illustrative embodiment. Configuration 700 includes wirebonds 702, 704, 706, 708, 710 .... Separation of adjacent wirebonds 702, 704 occurs in a first lateral distance and a first vertical distance. Orientation of wirebond 704 differs from orientation of wirebond 702. In one embodiment, wirebond 704 is substantially orthogonal to orientation of wirebond 702. In another embodiment, wirebond 704 is oriented at another suitable angle relative to wirebond 702, e.g., at any angle between 10 and 170 degrees. Separation of adjacent wirebonds 704, 706 occurs in a second lateral distance and a second vertical distance. Orientation of wirebond 706 differs from orientation of wirebond 704. In one embodiment, wirebond 706 is substantially orthogonal to orientation of wirebond 704. In another embodiment, wirebond 706 is oriented at another suitable angle relative to wirebond 704, e.g., at any angle between 10 and 170 degrees. In another embodiment, orientation of wirebond 706 is substantially similar to wirebond 702.

Separation of adjacent wirebonds 708, 706 occurs in a third lateral distance and a third vertical distance. Orientation of wirebond 708 differs from orientation of wirebond 706. In one embodiment, wirebond 708 is substantially orthogonal to orientation of wirebond 706. In another embodiment, wirebond 708 is oriented at another suitable angle relative to wirebond 706, e.g., at any angle between 10 and 170 degrees.

Separation of adjacent wirebonds 710, 708 occurs in a fourth lateral distance and a fourth vertical distance. Orientation of wirebond 710 differs from orientation of wirebond 708. In one embodiment, wirebond 710 is substantially orthogonal to orientation of wirebond 708. In another embodiment, wirebond 710 is oriented at another suitable angle relative to wirebond 708, e.g., at any angle between 10 and 170 degrees. The wirebonds can be arranged in variety of other arrangements within the scope of the illustrative embodiments. In one embodiment, the lateral distance between a first pair of adjacent wirebonds is equal to or differs from the lateral distance between a second pair of adjacent wirebonds. In another embodiment, the vertical distance between a first pair of adjacent wirebonds is equal to or differs from the vertical distance between a second pair of adjacent wirebonds.

In another embodiment, a method for determining a vertical distance of separation between adjacent wirebonds is calculated based on a predetermined lateral distance between adjacent wirebonds and a predetermined minimum separation distance between adjacent wirebonds. For example, selection of the predetermined lateral distance is based on q-chip size and desired number of qubits. In some embodiments, the predetermined minimum separation distance of wirebonds is set to minimize cross-talk between different signal lines. In one embodiment, selection of the predetermined minimum separation distance is based on q-chip size and desired number of qubits.

The vertical distance of separation between adjacent wirebonds is calculated from the predetermined lateral distance and the predetermined minimum separation distance. For example, the lateral distance, $\Delta x$, in FIG. 1 may be a predetermined lateral distance. As shown in FIG. 1, the lateral distance, $\Delta x$, and vertical distance, $\Delta y$, form a right angle. The hypotenuse of the right angle between $\Delta x$ and $\Delta y$ is the minimum separation distance between adjacent wirebonds. The vertical distance between adjacent wirebonds can be calculated based on the predetermined lateral distance, the minimum separation distance, and the orientation and configuration of the arrangement of wirebonds. For example, the Pythagorean theorem can be used to calculate the vertical distance between adjacent wirebonds in the arrangement shown in FIG. 1, based on the predetermined lateral distance and the minimum separation distance between adjacent wirebonds.

Various embodiments of the present invention are described herein with reference to the related drawings. Alternative embodiments can be devised without departing from the scope of this invention. Alternative embodiments which extend the number of wirebonds greater than the number shown in the various embodiments are contemplated within the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A configuration of wirebonds for reducing cross-talk in a quantum computing chip, comprising:
    a first wirebond coupling a first conductor of a quantum computing circuit with a first conductor of an external circuit; and
    a second wirebond coupling a second conductor of the quantum computing circuit with a second conductor of the external circuit,
    wherein the first wirebond extends from a first wirebond coupling portion thereof on the quantum computing chip and the second wirebond extends from a second wirebond coupling portion thereof on the quantum computing chip, and
    wherein the first and second wirebond coupling portions are separated by a first vertical distance in a direction of a length of the first conductor.

2. The configuration of claim 1, wherein an orientation of the second wirebond is angled from an orientation of the first wirebond.

3. The configuration of claim 2, wherein the orientation of the second wirebond is substantially orthogonal to the orientation of the first wirebond.

4. The configuration of claim 2, wherein the orientation of the second wirebond is substantially parallel to the orientation of the first wirebond.

5. The configuration of claim 1, further comprising:
    a third wirebond coupling a third conductor of the quantum computing circuit with a third conductor of the external circuit, wherein the second wirebond and the third wirebond are separated by a second vertical distance.

6. The configuration of claim 5, wherein the first vertical distance and the second vertical distance are equal.

7. The configuration of claim 5, wherein an orientation of the third wirebond is angled from an orientation of the second wirebond.

8. The configuration of claim 7, wherein the orientation of the third wirebond is substantially similar to an orientation of the first wirebond.

9. The configuration of claim 5, further comprising:
    a fourth wirebond coupling a fourth conductor of the quantum computing circuit with a fourth conductor of the external circuit, wherein the third wirebond and the fourth wirebond are separated by a third vertical distance.

10. The configuration of claim 9, wherein the third vertical distance is equal to a sum of the first vertical distance and the second vertical distance.

11. The configuration of claim 9, wherein the third vertical distance is equal to the first vertical distance.

12. The configuration of claim 9, wherein the third vertical distance is equal to the second vertical distance.

13. The configuration of claim 9, wherein an orientation of the fourth wirebond is angled from an orientation of the third wirebond.

14. The configuration of claim 9, wherein an orientation of the fourth wirebond is substantially parallel to an orientation of the second wirebond.

15. A circuit fabrication system performing operations comprising:
    configuring a first wirebond to couple a first conductor of a quantum computing circuit on a quantum computing chip with a first conductor of an external circuit; and
    configuring a second wirebond to couple a second conductor of the quantum computing circuit with a second conductor of the external circuit,
    wherein the first wirebond extends from a first wirebond coupling portion thereof on the quantum computing chip and the second wirebond extends from a second wirebond coupling portion thereof on the quantum computing chip, and
    wherein the first and second wirebond coupling portions are separated by a first vertical distance in a direction of a length of the first conductor.

* * * * *